United States Patent
Lee et al.

(10) Patent No.: US 7,687,311 B1
(45) Date of Patent: Mar. 30, 2010

(54) METHOD FOR PRODUCING STACKABLE DIES

(75) Inventors: Bo-I Lee, Sindian (TW); Tsung-Ding Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/329,138

(22) Filed: Dec. 5, 2008

Related U.S. Application Data (60) Provisional application No. 61/114,268, filed on Nov. 13, 2008.

(51) Int. Cl.
*H01L 21/44* (2006.01)
(52) U.S. Cl. ............... 438/106; 438/107; 438/108; 438/113; 438/118; 438/149; 257/E21.597
(58) Field of Classification Search ............ None
See application file for complete search history.

(56) References Cited

U.S. PATENT DOCUMENTS 6,844,236 B2 * 1/2005 Ivanov et al. ............ 438/406

2006/0108146 A1 * 5/2006 Wu et al. ............ 174/260
2007/0048969 A1 * 3/2007 Kwon et al. ............ 438/455

* cited by examiner

*Primary Examiner*—N Drew Richards
*Assistant Examiner*—Kyoung Lee
(74) *Attorney, Agent, or Firm*—Slater & Matsil, L.L.P.

(57) ABSTRACT

A system and method for improved semiconductor die production is provided. A preferred embodiment provides a method for creating a stackable die, the method includes providing a first substrate, and forming through-silicon vias in the first substrate. The through-silicon vias extend from a first surface of the first substrate, wherein the through-silicon vias connect to a conductive layer on the first surface of the first substrate, and wherein the conductive layer has a planar surface. The conductive layer joins to a carrier substrate with an adhesive. The method continues by joining a second substrate to a second surface of the first substrate, removing the carrier substrate, removing the adhesive layer, and patterning the conductive layer to form contact pads.

19 Claims, 10 Drawing Sheets

METHOD FOR PRODUCING STACKABLE DIES

This application claims the benefit of U.S. Provisional Application No. 61/114,268, filed on Nov. 13, 2008, entitled "Improved Method for Producing Stackable Dies," which application is hereby incorporated herein by reference.

TECHNICAL FIELD

The present invention relates generally to integrated circuits and, more particularly, to a device and method for improved stackable die production.

BACKGROUND

Since the invention of the integrated circuit, the semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more components to be integrated into a given area.

In an attempt to further increase circuit density, three-dimensional (3D) integrated circuits (ICs) have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled the contact pads on each die to contact pads on the carrier substrate. This attempt, however, requires a carrier substrate larger than the dies for the wire bonding.

More recent attempts have focused on through-silicon vias (TSVs). Generally, a TSV is formed by etching a vertical via through a substrate and filling the via with a conductive material, such as copper. The backside of the substrate is thinned to expose the TSVs, and solder balls are placed directly on the TSVs to provide an electrical contact. Copper bumps are formed as electrical contacts on the circuit side of a substrate of another die, wherein the copper bumps are electrically coupled to the TSVs.

Generally, the copper bumps on the circuit side of the substrate are formed prior to thinning of the backside of the substrate. In order to conduct the backside thinning process to expose the TSVs, the circuit side is joined to a carrier substrate by an adhesive that also covers the copper bumps. After the thinning process and bonding the two semiconductor dies, the carrier substrate and the adhesive are removed. Due to the uneven surface topography created by the copper bumps, it is often difficult to remove all of the adhesive from the semiconductor die, thus leaving an adhesive residue at topographical changes on the circuit side of the die.

Additionally, processes of forming copper bumps on the circuit side of the semiconductor device require an under bump metallization (UBM). Generally, aluminum comprises the final metal layer of most integrated circuits; however, aluminum does not bond well with the copper bumps used to form the circuit side electrical contacts of a semiconductor die. UBM is an additional metal layer added to the die between the aluminum metal layer and the copper bumps. The UBM layer prevents diffusion between the bump and the integrated circuits of the die, while also providing a low resistance electrical connection that is strong and stable. UBM materials, such as an electroless nickel immersion gold, are expensive materials that significantly increase the cost and manufacturing requirements of semiconductor die production.

Accordingly, there is a need for a better method of producing stackable dies that reduces the amount of adhesive residue remaining on the die after formation while also reducing the need for UBM.

SUMMARY OF THE INVENTION

These and other problems are generally solved or circumvented, and technical advantages are generally achieved, by preferred embodiments of the present invention which provide a method for creating a stackable die, the method comprising providing a first substrate, forming through-silicon vias in the first substrate extending from a first surface of the first substrate, wherein the through-silicon vias connect to a conductive layer on the first surface of the first substrate, and wherein the conductive layer has a planar surface, and joining a carrier substrate to the conductive layer with an adhesive. The method continues by joining a second substrate to a second surface of the first substrate, removing the carrier substrate, removing the adhesive layer, and patterning the conductive layer to form contact pads.

Another embodiment of the present invention provides a method for creating a semiconductor device, the method comprising providing a first substrate, forming through-silicon vias in the first substrate, forming a conductive layer on a circuit side of the first substrate, joining a second substrate to a second surface of the first substrate, and patterning the conductive layer to form electrical contacts after the joining.

Yet another embodiment of the present invention provides a semiconductor device comprising a first substrate having electrical circuitry formed thereon, one or more dielectric layers formed over the first substrate, through-silicon vias extending through one or more dielectric layers into the first substrate, and first contact pads over the dielectric layers, wherein the first contact pads and the through-silicon vias comprise a single conductive layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. Throughout the various views and illustrative embodiments of the present invention, like reference numbers are used to designate like elements.

Figure 1:
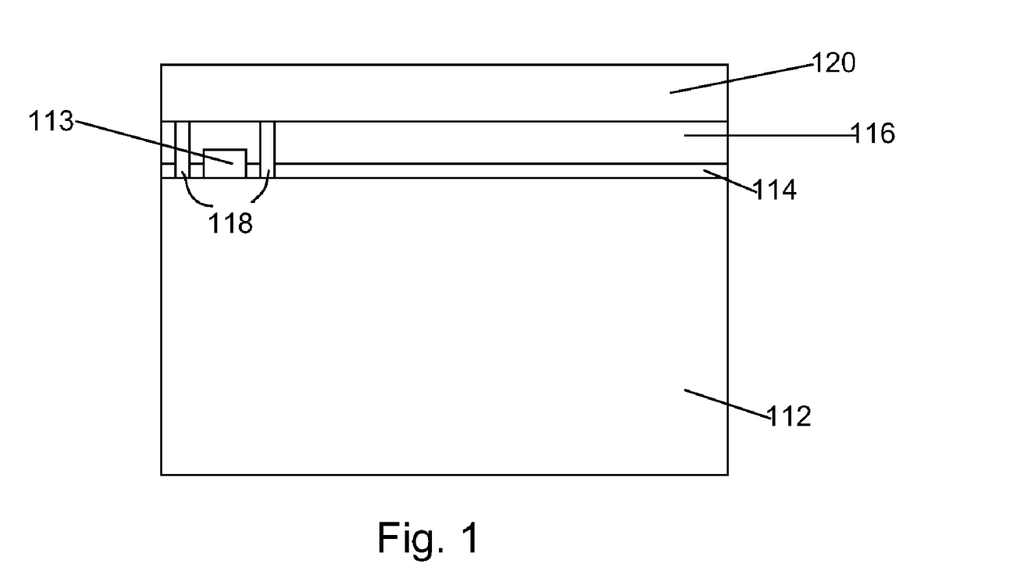
FIGS. 1-20 illustrate intermediate stages in the improved process for creating a stackable semiconductor die.

FIGS. 1-20 are cross-sectional views of intermediate stages in the making of an embodiment of the present invention. Referring first to FIG. 1, a first substrate 112 is shown having electrical circuitry 113 formed thereon. The first substrate 112 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrates may also be used.

The electrical circuitry 113 formed on the first substrate 112 may be any type of circuitry suitable for a particular application. In an embodiment, the circuitry includes electrical devices formed on the substrate with one or more dielectric layers overlying the electrical devices. Metal layers may be formed between dielectric layers to route electrical signals between the electrical devices. Electrical devices may also be formed in one or more dielectric layers.

For example, the electrical circuitry 113 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

Also shown in FIG. 1 are an etch stop layer 114 and an inter-layer dielectric (ILD) layer 116. The etch stop layer 114 is preferably formed of a dielectric material having a different etch selectivity from adjacent layers, e.g., the underlying first substrate 112 and the overlying ILD layer 116. In an embodiment, the etch stop layer 114 may be formed of SiN, SiCN, SiCO, CN, combinations thereof, or the like deposited by chemical vapor deposition (CVD) or plasma-enhanced CVD (PECVD) techniques.

The ILD layer 116 may be formed, for example, of a low-K dielectric material, such as silicon oxide, phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof or the like, by any suitable method known in the art, such as spinning, CVD, and PECVD. It should also be noted that the etch stop layer 114 and the ILD layer 116 may each comprise a plurality of dielectric layers, with or without an etch stop layer formed between adjacent dielectric layers.

Contacts 118 are formed through the ILD layer 116 to provide an electrical contact to the electrical circuitry 113. The contacts 118 may be formed, for example, by using photolithography techniques to deposit and pattern a photoresist material on the ILD layer 116 to expose portions of the ILD layer 116 that are to become the contacts 118. An etch process, such as an anisotropic dry etch process, may be used to create openings in the ILD layer 116. The openings are, preferably, lined with a diffusion barrier layer and/or an adhesion layer (not shown), and filled with a conductive material. Preferably, the diffusion barrier layer comprises one or more layers of TaN, Ta, TiN, Ti, CoW, or the like, and the conductive material comprises copper, tungsten, aluminum, silver, and combinations thereof, or the like, thereby forming the contacts 118 as illustrated in FIG. 1.

One or more inter-metal dielectric (IMD) layers 120 and the associated metallization layers (not shown) are formed over the ILD layer 116. Generally, the one or more IMD layers 120 and the associated metallization layers are used to interconnect the electrical circuitry 113 to each other and to provide an external electrical connection. The IMD layers 120 are preferably formed of a low-K dielectric material, such as fluorosilicate glass (FSG) formed by PECVD techniques or high-density plasma chemical vapor deposition (HD-PCVD) or the like, and may include intermediate etch stop layers, similar to the etch stop layer 114.

Figure 2:
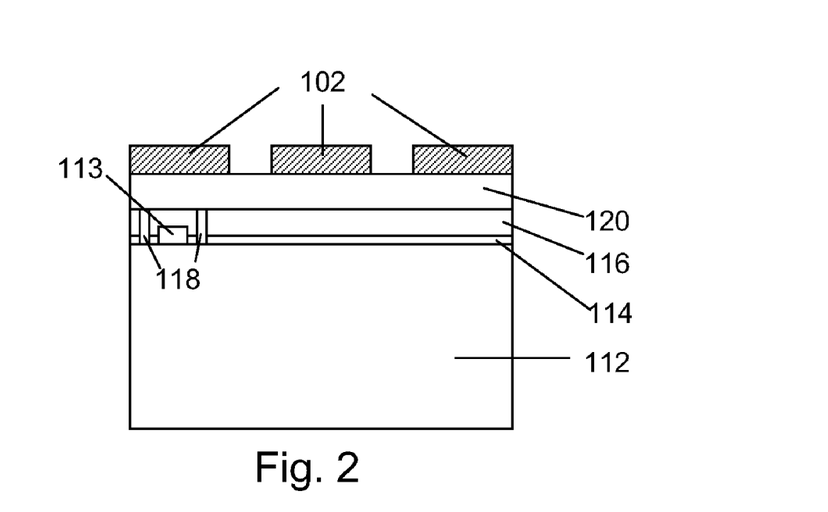

Referring now to FIG. 2, a first mask layer 102 formed overlying the IMD layers 120 is shown. In an embodiment, the first mask layer 102 comprises a photoresist material that has been applied and patterned on the underlying IMD layers 120, although other materials having a high-etch selectivity with the underlying material of the IMD layers 120 may be used. Generally, the first mask layer 102 may be formed of a photoresist material by depositing a layer of photoresist material and exposing the photoresist material in accordance with a desired pattern. After the photoresist material is exposed, the photoresist material is developed to remove unwanted portions of the photoresist material, thereby forming the first mask layer 102 as illustrated in FIG. 2. Other materials, such as SiN, $SiO_2$, or the like, may be used to form the mask layer.

Figure 3:
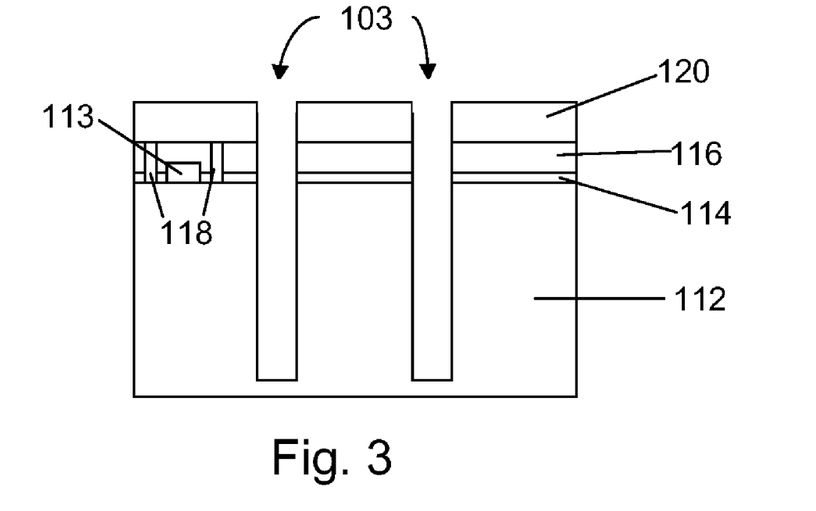

Thereafter, one or more etching processes may be performed to create openings 103 as illustrated in FIG. 3. In an embodiment, a timed etching process, such as an anisotropic dry etch process, is performed until a desired depth for the openings 103 is obtained in the first substrate 112. It should be understood that the etch processes described herein may be accomplished in single etch processes or multiple etch processes. For example, a first etch process may be performed to etch through the IMD layers 120 and/or the ILD layer 116, and one or more second etch processes may be performed to etch through the etch stop layer 114 and/or the first substrate 112. It should also be understood that the openings 103 may be formed by other methods, such as milling, laser techniques, or the like.

Figure 4:
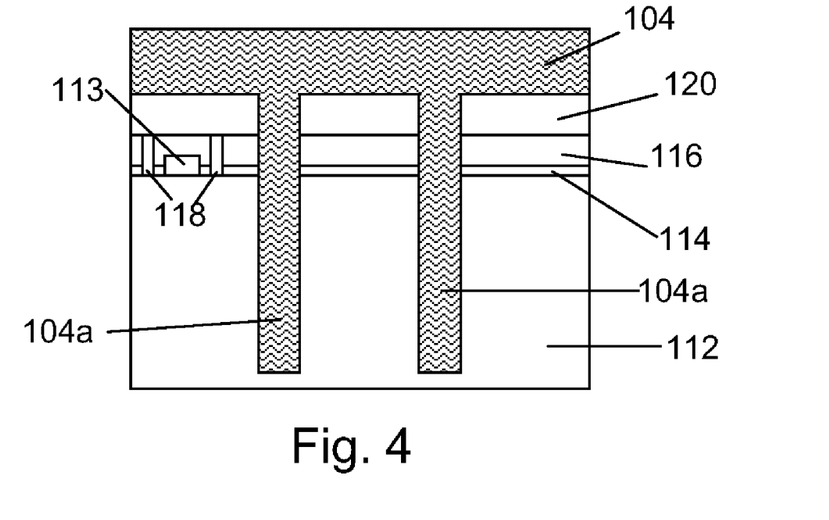

FIG. 4 illustrates a conductive layer 104 filling the openings 103 in accordance with an embodiment of the present invention. The conductive layer 104 is preferably copper, but can be any suitable conductive material, such as copper alloys, aluminum, tungsten, silver and combinations thereof. The conductive layer 104 is preferably applied using a plating mechanism, although other appropriate mechanisms for formation of the conductive layer 104 may be used. A planarization process is performed on a surface of the conductive layer 104 creating a substantially smooth surface. The filling of the openings 103 with the conductive layer 104 creates through-silicon vias (TSVs) 104a.

In an embodiment, the TSVs 104a may include a barrier layer (not shown) interposed between the conductive layer 104 and the surrounding materials (e.g., the IMD layers 120, the ILD layer 116, the etch stop layer 114, and the first substrate 112). The barrier layer reduces the incidence of diffusion between the subsequent conductive material placed into the openings 103 and the surrounding materials. The openings 103 may be lined with one or more layers of SiN, an oxide, a polymer, or the like. Other materials, including conductive diffusion barrier layers, such as TaN, Ta, TiN, Ti, CoW, or the like, may also be used.

It should be noted that, while the TSVs 104a are illustrated as extending from an uppermost IMD layer 120 into the first substrate 112, other TSV configurations may be used. For example, embodiments of the present invention may utilize TSVs that extend from a surface of the first substrate 112, the ILD layer 116, an intermediate layer of the IMD layers 120, or the like.

Figure 5:
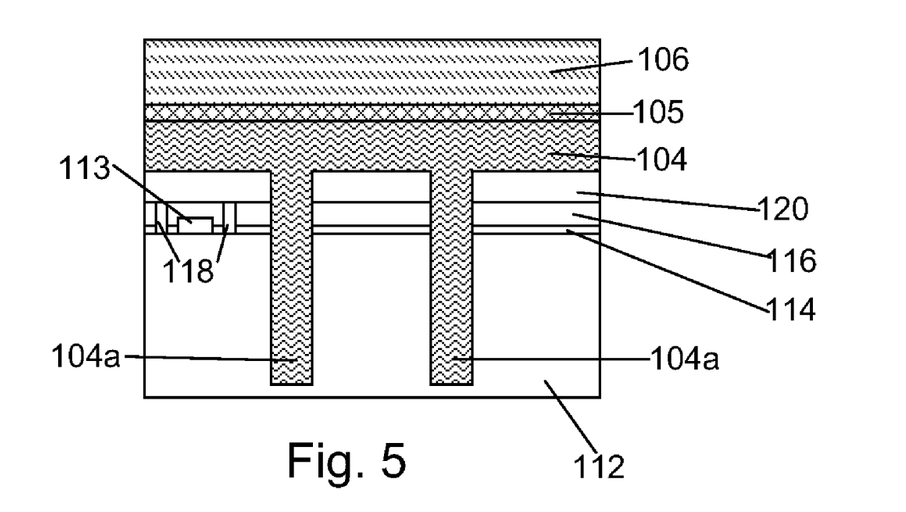

As shown in FIG. 5, a carrier substrate 106 is attached to a top surface of the conductive layer 104 using an adhesive 105. Generally, the carrier substrate 106 provides temporary mechanical and structural support during subsequent processing stages. The carrier substrate 106 may comprise, for example, glass, silicon oxide, aluminum oxide, and the like. The adhesive 105 may be any suitable adhesive, such as an ultraviolet (UV) glue, which loses its adhesive property when exposed to UV lights. The adhesive 105 is preferably applied in a lamination process, but the present invention contemplates additional means to join the adhesive 105 to the conductive layer 104 and the carrier substrate 106. The preferred thickness of the carrier substrate 106 is such that the carrier substrate 106 provides sufficient mechanical support for the described semiconductor structure.

It will be apparent to one of ordinary skill in the art that adhesion to the carrier substrate 106 prior to formation of electrical contacts from the conductive layer 104 creates a substantially planar contact area for application of the adhesive 105. As discussed in greater detail below, applying the adhesive 105 to a substantially planar surface allows for removal of the adhesive 105 in a manner which leaves little or no residue on the surface of the conductive layer 104.

Figure 6:
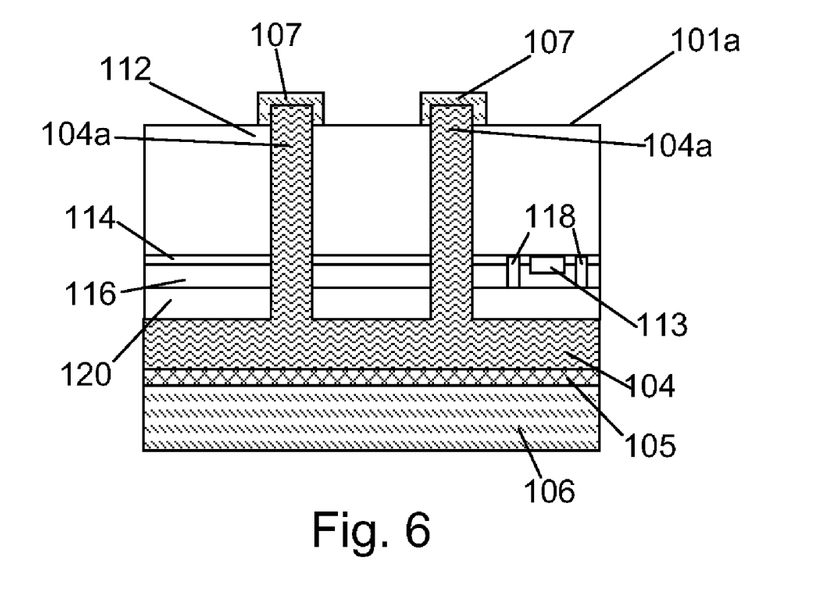

FIG. 6 illustrates a thinning process performed on a backside 101a of the first substrate 112 to expose the TSVs 104a in accordance with an embodiment of the present invention. The thinning process may be performed using a mechanical grinding process, a chemical mechanical polishing (CMP) process, an etching process, and/or a combination thereof. For example, initially a planarizing process, such as grinding or CMP, may be performed to initially expose the TSVs 104a. Thereafter, a wet or dry etching process having a high etch-rate selectivity between the material of the TSVs 104a and the material of the first substrate 112 may be performed to recess the first substrate 112, thereby leaving the TSVs 104a protruding from the underside of the first substrate 112 as illustrated in FIG. 6. In an embodiment in which the TSVs 104a are formed of copper, the backside 101a of the first substrate 112 may be recessed by, for example, performing a dry etch process using $HBr/O_2$, $HBr/Cl_2/O_2$, $SF_6/CL_2$, $SF_6$ plasma, or the like.

FIG. 6 also illustrates a diffusion barrier layer 107 formed over the protruding portions of the TSVs 104a. In an embodiment, the diffusion barrier layer 107 is an electroless nickel immersion gold (ENIG) layer, but any appropriate diffusion barrier material may be used.

Figure 7:
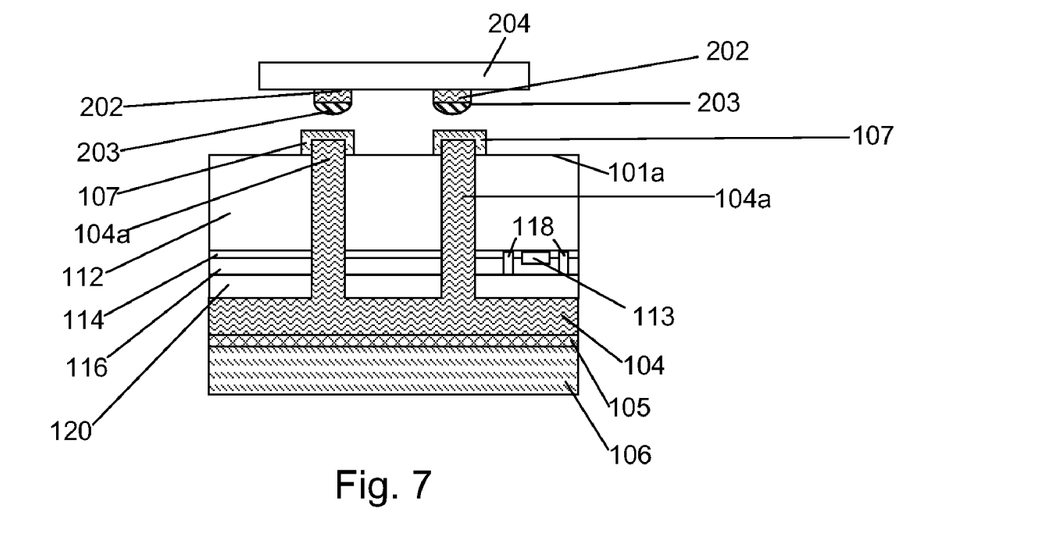

FIG. 7 illustrates the bonding of conductive bumps 202 of a second substrate 204 to the corresponding TSVs 104a with bonding agents 203. The second substrate 204 may be a wafer or die including electrical circuitry, such as that discussed above with reference to FIG. 1, wherein the conductive bumps 202 and the bonding agents 203 provide an external electrical connection. The conductive bumps 202 preferably comprise copper, but can be any suitable conducting material, such as copper alloys, aluminum, tungsten, silver and combinations thereof. The bonding agent 203 is preferably a solder, but the present invention contemplates any bonding medium suitable for the transfer of electrical signals between the conductive bumps 202 and the corresponding TSVs 104a.

Figure 8:
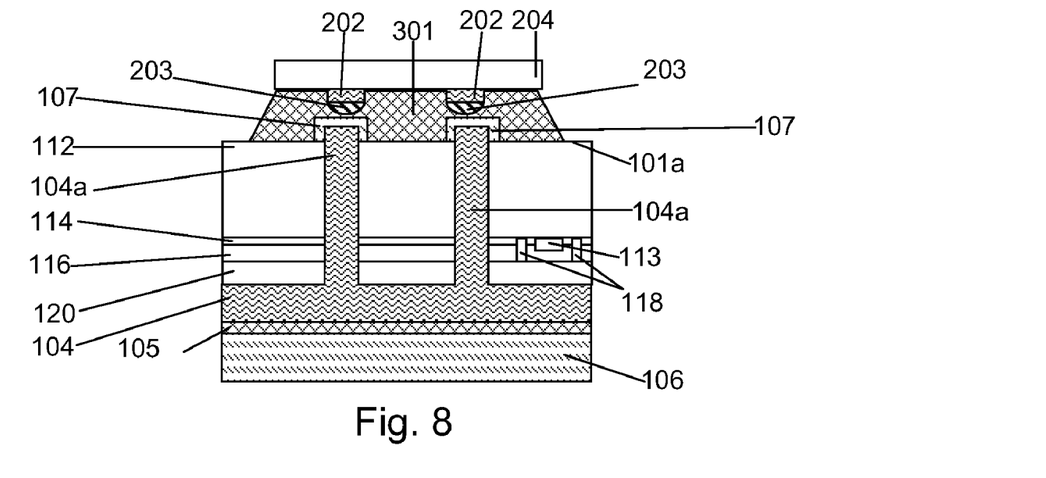

As shown in FIG. 8, an underfill material 301 is placed into the spaces between the first substrate 112 and the second substrate 204 in order to create a gapless structure and greater mechanical strength. The underfill material 301 preferably comprises an epoxy that is injected between the first substrate 112 and the second substrate 204. Other processes and materials, however, may be used.

Figure 9:
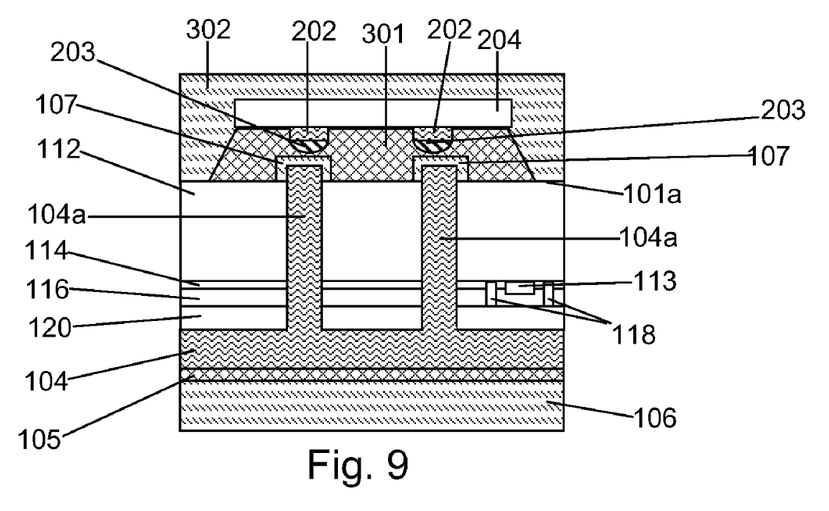
Figure 10:
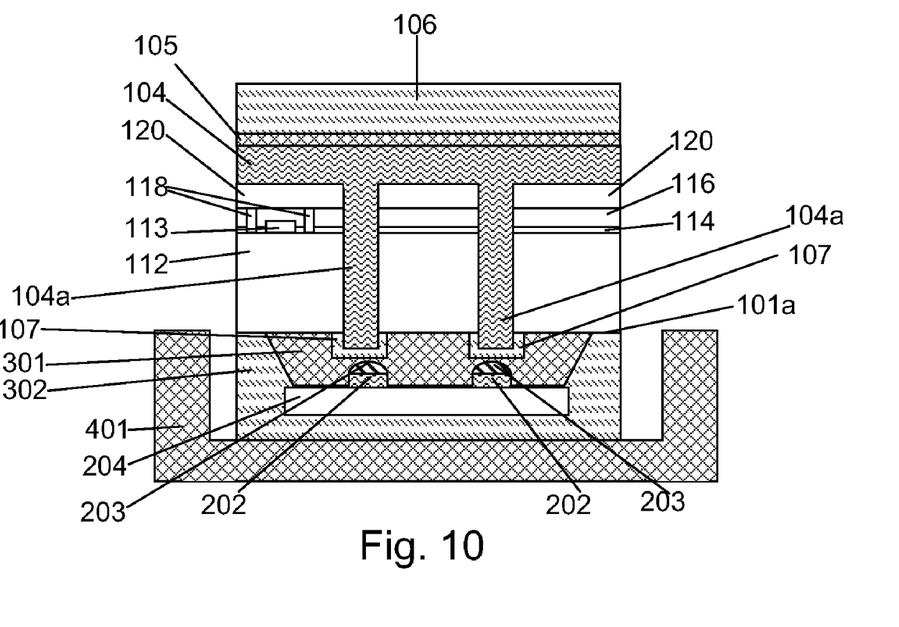

Referring now to FIG. 9, an encapsulant 302 is applied, by any appropriate method, around the second substrate 204, substantially covering the second substrate 204, and the backside 101a of the first substrate 112. The encapsulant 302 preferably comprises any appropriate encapsulant, such as an epoxy-based material. FIG. 10 illustrates the combined second substrate 204 and the first substrate 112 mounted to a film frame 401. The encapsulant 302 joins, by any appropriate method, to the film frame 401 to secure the combined structure to the film frame 401 during the removal of the carrier substrate 106 and the adhesive 105.

Figure 11:
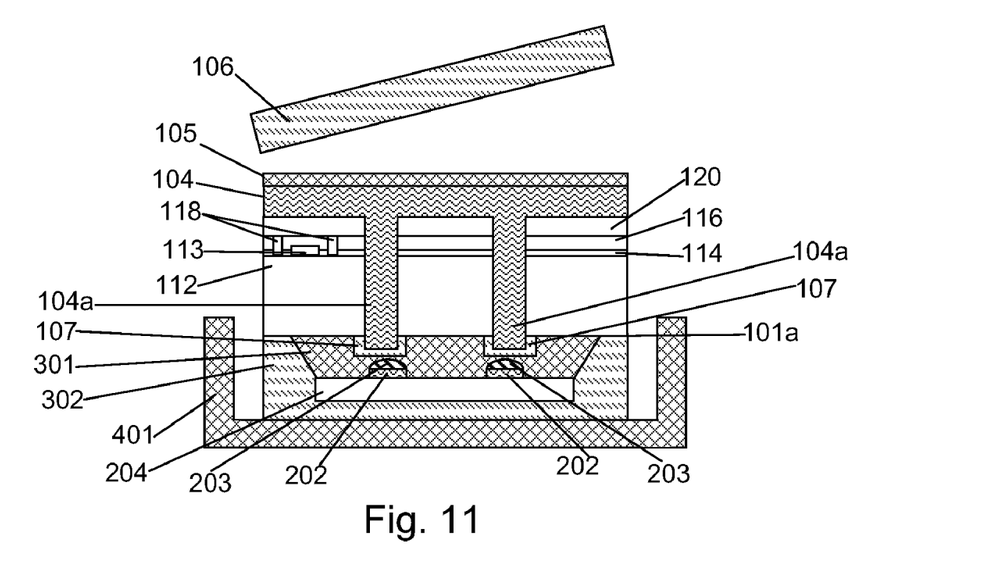

As shown in FIG. 11, a de-bonding process, such as UV light exposure, is performed to remove the carrier substrate 106 from the adhesive 105. The de-bonding process preferably comprises any appropriate de-bonding process, such that the underlying semiconductor structures retain their integrity.

Figure 12:
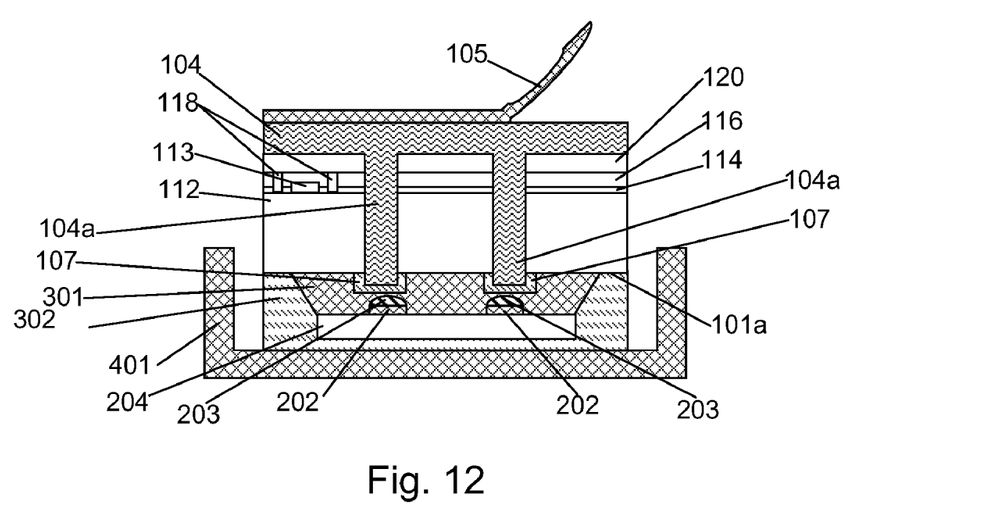
Figure 13:
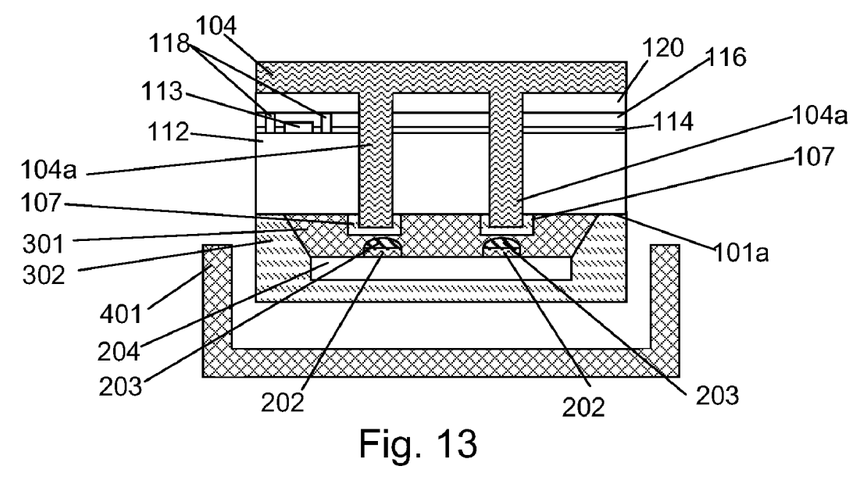

Referring to FIG. 12, the adhesive 105 is removed from the conductive layer 104. This is preferably done in a peeling manner using mechanical instruments. The present invention contemplates use of any appropriate method to remove the adhesive 105, including any additional chemical or physical methods. Advantageously, there are no conductive bumps on the surface of the conductive layer 104, thereby creating a planar surface. Because of the planar surface, the adhesive 105 is more easily removed, leaving little or no residue caught in crevices around conductive bumps or other structures that may be formed on the surface of the conductive layer 104. As shown in FIG. 13, the film frame 401 is then separated from the encapsulant 302.

Figure 14:
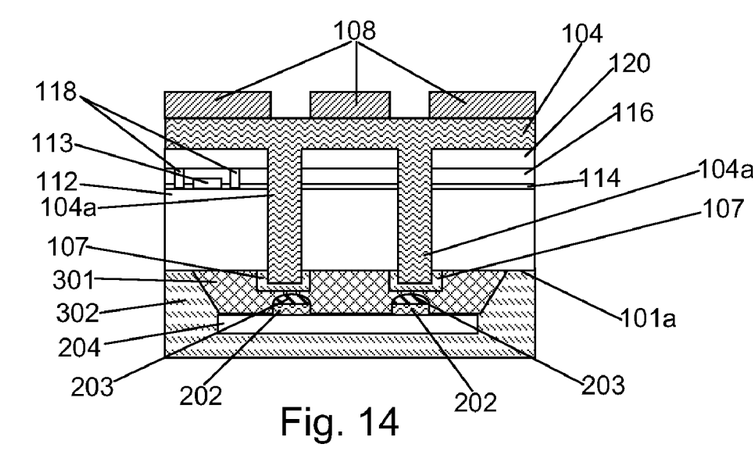

Referring now to FIG. 14, a second mask layer 108 formed overlying the conductive layer 104 is shown. In an embodiment, the second mask layer 108 comprises a photoresist material that has been applied and patterned on the underlying conductive layer 104, although other materials having a high-etch selectivity with the underlying conductive layer 104 may be used. Generally, the second mask layer 108 may be formed of a photoresist material by depositing a layer of photoresist material and exposing the photoresist material in accordance with a desired pattern. After the photoresist material is exposed, the photoresist material is developed to remove unwanted portions of the photoresist material, thereby forming the second mask layer 108 as illustrated in FIG. 14. Other materials and processes, including the use of one or more hard masks, may also be used.

Figure 15:
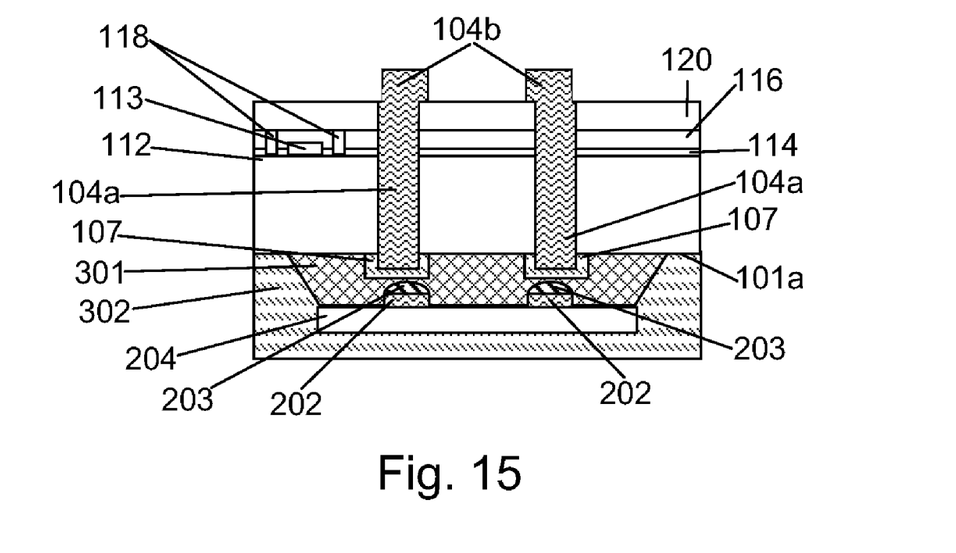

Thereafter, one or more etching processes may be performed to remove portions of the conductive layer 104 as illustrated in FIG. 15. In an embodiment, an etching process, such as an anisotropic dry etch process, creates conductive elements 104b from the conductive layer 104. The conductive elements 104b form the basis for both a redistribution layer and conductive bumps that allow an electrical signal to travel from the location of the TSVs 104a to other devices external to the structure described herein. Once etching of the conductive layer 104 is completed, the second mask layer 108 is removed. It should be understood that the etch processes described herein may be accomplished in single etch processes or multiple etch processes. It should also be understood that the openings may be formed by other methods.

Figure 16:
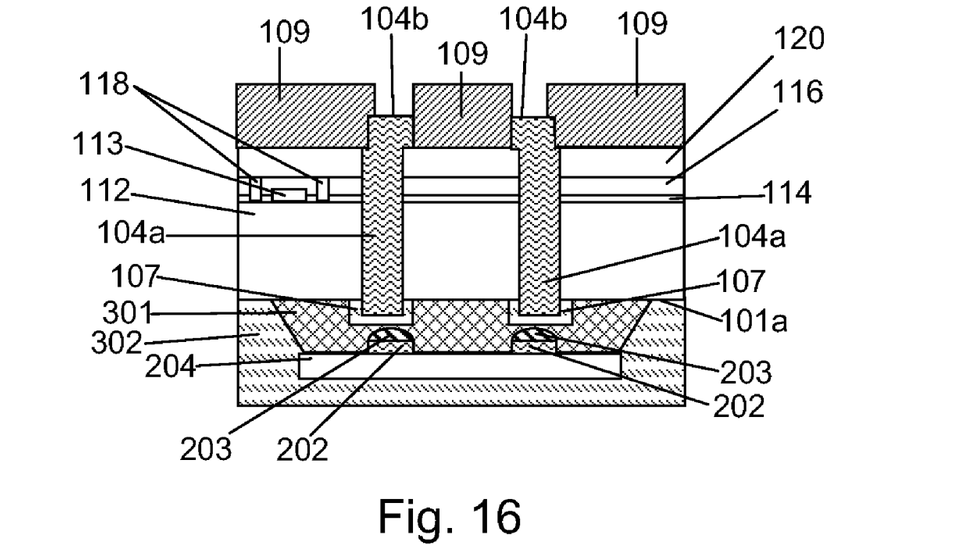

Referring now to FIG. 16, a third mask layer 109 formed overlying the IMD layers 120 and a portion of the conductive elements 104b is shown. In an embodiment, the third mask layer 109 comprises a photoresist material that has been applied and patterned on the underlying IMD layers 120 and the conductive elements 104b, although other materials having a high-etch selectivity with the underlying conductive elements 104b may be used.

Figure 17:
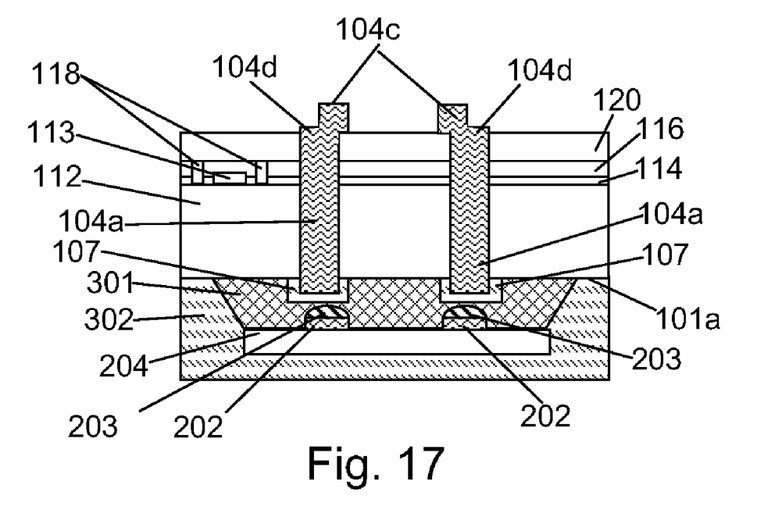

Thereafter, one or more etching processes may be performed to remove portions of the conductive elements 104b as illustrated in FIG. 17. In an embodiment, a timed etching process, such as a dry etching process, thins a portion of the conductive elements 104b, thereby forming conductive bumps 104c and redistribution layers 104d. Once etching of the conductive elements 104b is completed, the third mask layer 109 is removed. It should be understood that the etch processes herein may be accomplished in single etch processes or multiple etch processes.

Figure 18:
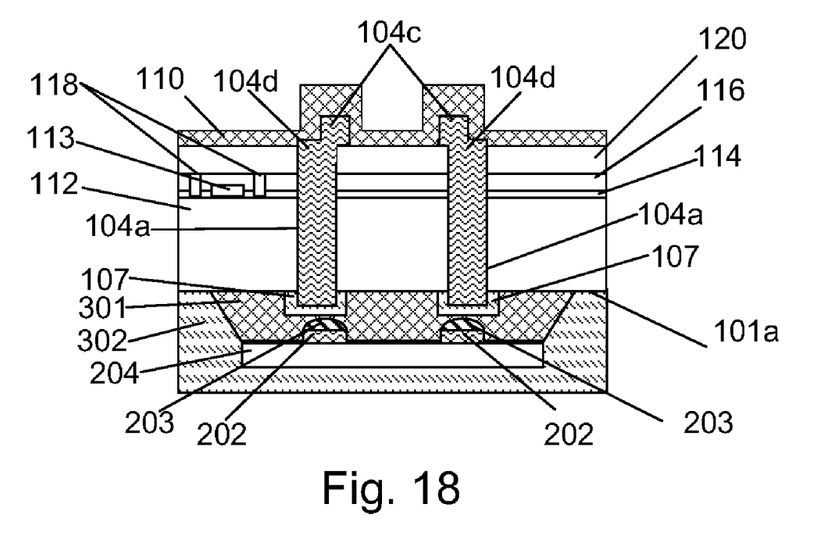

As illustrated in FIG. 18, a buffer layer 110 is deposited, by any appropriate method, on the top surface of IMD layers 120, covering the redistribution layers 104d and the conductive bumps 104c. The buffer layer 110 relieves mechanical stress arising due to the expansion and contraction of the various materials in the semiconductor structure caused by thermal expansion. In an embodiment, the buffer layer 110 is a polyimide layer, but any suitable material may be used to form the buffer layer 110.

Figure 19:
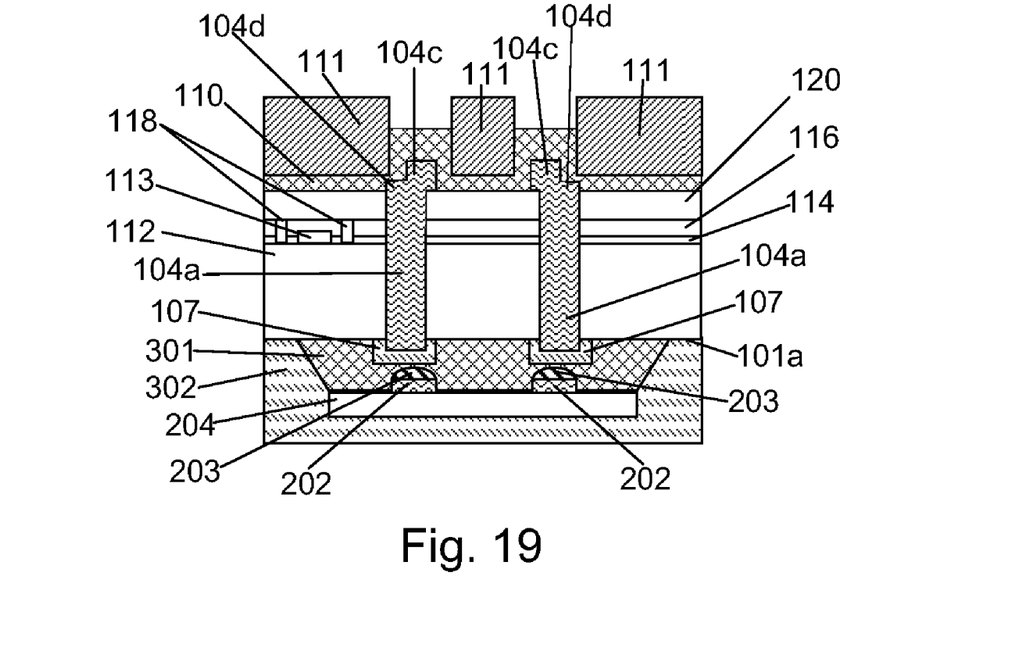

Referring now to FIG. 19, a fourth mask layer 111 formed overlying the buffer layer 110 is shown. In an embodiment, the fourth mask layer 111 comprises a photoresist material that has been applied and patterned on the underlying buffer layer 110, although other materials having a high-etch selectivity with the underlying buffer layer 110 may be used.

Figure 20:
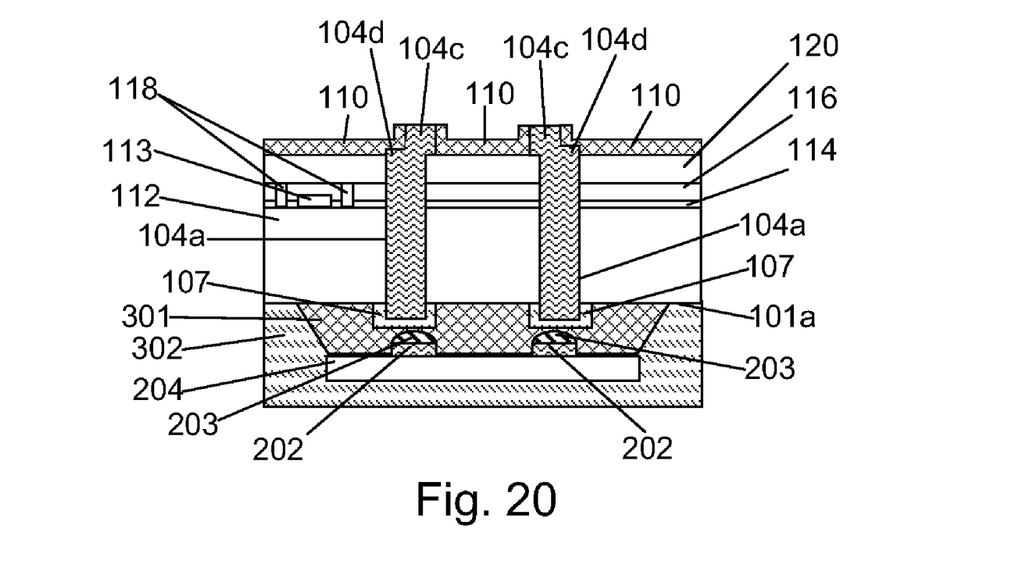

Thereafter, one or more etching processes may be performed to remove portions of the buffer layer 110 as illustrated in FIG. 20. In an embodiment, an etching process, such as a dry etching process, exposes the conductive bumps 104c for an electrical connection with external devices (not shown). Once etching of the buffer layer 110 is completed, the fourth mask layer 111 is removed. It should be understood that the etch processes described herein may be accomplished in single etch processes or multiple etch processes.

It should be appreciated that in addition to providing a semiconductor substrate with a planar surface that allows for removal of the adhesive holding the semiconductor substrate to a carrier substrate that leaves little or no residue on the semiconductor substrate, the present invention removes the need for an under bump metallization (UBM). The process described herein combines the separate TSV, redistribution layer, and conductive bump structures into a single structure. By combining the separate structures, a low resistance electrical connection is created without requiring expensive UBM materials. This allows for significant cost.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for creating a stackable die, the method comprising:
   providing a first substrate;
   forming through-silicon vias in the first substrate extending from a first surface of the first substrate, wherein the through-silicon vias connect to a conductive layer on the first surface of the first substrate, and wherein the conductive layer has a planar surface;
   joining a carrier substrate to the conductive layer with an adhesive;
   joining a second substrate to a second surface of the first substrate;
   removing the carrier substrate;
   removing the adhesive; and
   patterning the conductive layer to form contact pads.

2. The method of claim 1, wherein the joining the second substrate to the second surface of the first substrate comprises:
   removing a portion of the second surface of the first substrate, thereby exposing the through-silicon vias;
   forming a diffusion barrier layer over the through-silicon vias; and
   joining contact pads of the second substrate to respective through-silicon vias of the first substrate.

3. The method of claim 2, further comprising forming an encapsulation layer around the second substrate, wherein the encapsulation layer substantially covers the second substrate and the second surface of the first substrate.

4. The method of claim 3, wherein the diffusion barrier layer comprises an electroless nickel immersion gold (ENIG) layer.

5. The method of claim 1, wherein the patterning the conductive layer to form the contact pads comprises:
   patterning the conductive layer to create conductive elements; and
   patterning the conductive elements to define a redistribution layer and the contact pads.

6. The method of claim 5, wherein the patterning the conductive layer to form the contact pads further comprises:
   forming a buffer layer over the redistribution layer and the contact pads; and
   patterning the buffer layer to expose the contact pads.

7. The method of claim 6, wherein the buffer layer comprises a polyimide layer.

8. A method for creating a semiconductor device, the method comprising:
   providing a first substrate having a semiconductor substrate with electrical circuitry formed thereon and one or more dielectric layers overlying the electrical circuitry;
   forming through-silicon vias in the first substrate, the through-silicon vias extending through the semiconductor substrate;
   forming a conductive layer on a circuit side of the first substrate;
   joining a second substrate to a backside of the first substrate, wherein the backside of the first substrate is opposite the circuit side of the first substrate; and
   patterning the conductive layer to form electrical contacts after the joining.

9. The method of claim 8, wherein the through-silicon vias extend from the circuit side of the first substrate and connect to the conductive layer on the circuit side of the first substrate, and wherein the conductive layer has a planar surface.

10. The method of claim 8, wherein the through-silicon vias in the first substrate and the conductive layer on the circuit side of the first substrate comprise a single conductive layer.

11. The method of claim 8, wherein the conductive layer has a planar surface.

12. The method of claim 8, further comprising:
applying an adhesive to a surface of the conductive layer; and
joining a carrier substrate to the adhesive.

13. The method of claim 8, wherein the joining the second substrate to the backside of the first substrate comprises:
removing a portion of the backside of the first substrate, thereby exposing the through-silicon vias;
forming a diffusion layer covering a portion of the exposed through-silicon vias on the backside of the first substrate;
electrically coupling contact pads of the second substrate to the through-silicon vias of the first substrate; and
forming an encapsulant around the second substrate, wherein the encapsulant substantially covers the second substrate and the backside of the first substrate.

14. The method of claim 13, wherein the diffusion layer comprises a layer of electroless nickel immersion gold (ENIG).

15. The method of claim 8, wherein the patterning the conductive layer to form the electrical contacts comprises:
forming a first mask layer over the conductive layer to expose a first pattern on the conductive layer;
patterning the conductive layer according to the exposed first pattern to create conductive elements;
forming a second mask layer over the conductive elements to expose a second pattern on the conductive elements; and
patterning the conductive elements according to the exposed second pattern to define a redistribution layer and contact pads.

16. The method of claim 15, further comprising:
forming a buffer layer over the redistribution layer and the contact pads; and
patterning the buffer layer to expose the contact pads.

17. The method of claim 16, wherein the buffer layer comprises a polyimide layer.

18. A semiconductor device comprising:
a first substrate having electrical circuitry formed thereon;
one or more dielectric layers formed over the first substrate;
through-silicon vias extending through the one or more dielectric layers into the first substrate;
first contact pads over the one or more dielectric layers, wherein the first contact pads and the through-silicon vias comprise a single conductive structure;
a second surface of the first substrate thinned, exposing the through-silicon vias;
a second substrate having second contact pads residing on a first surface of the second substrate, the second contact pads coupled to the through-silicon vias of the first substrate;
a diffusion barrier layer interposed between the through-silicon vias on the second surface of the first substrate and the second contact pads residing on the first surface of the second substrate; and
an encapsulant covering the second substrate and the second surface of the first substrate.

19. The semiconductor device of claim 18, further comprising a buffer layer over a first surface of the first substrate.

\* \* \* \* \*